United States Patent [19]

Tabata

[11] Patent Number: 4,780,425
[45] Date of Patent: Oct. 25, 1988

[54] METHOD OF MAKING A BIPOLAR TRANSISTOR WITH DOUBLE DIFFUSED ISOLATION REGIONS

[75] Inventor: Teruo Tabata, Gumma, Japan

[73] Assignee: Sanyo Electric Co., Ltd., Japan

[21] Appl. No.: 119,668

[22] Filed: Nov. 12, 1987

Related U.S. Application Data

[63] Continuation of Ser. No. 852,231, Apr. 15, 1986, abandoned.

[30] Foreign Application Priority Data

Apr. 19, 1985 [JP] Japan ............................ 60-84831
Apr. 19, 1985 [JP] Japan ............................ 60-84834
Jan. 13, 1986 [JP] Japan ............................ 61-4597
Feb. 18, 1986 [JP] Japan ............................ 61-34807

[51] Int. Cl.$^4$ ...................... H01L 21/20; H01L 27/04
[52] U.S. Cl. .................... 437/31; 148/DIG. 11;
148/DIG. 35; 148/DIG. 38; 357/34; 357/48;
437/76; 437/149; 437/152; 437/154; 437/166;
437/953
[58] Field of Search ............... 148/DIG. 10, 11, 30,
148/32, 35, 38, 83; 357/34, 43, 20, 48; 437/25,
26, 31, 34, 55, 76, 75, 82, 149, 152, 154, 166, 953

[56] References Cited

U.S. PATENT DOCUMENTS

| | | | |
|---|---|---|---|
| 3,911,470 | 10/1975 | Ruegg | 357/36 |
| 3,930,909 | 1/1976 | Schmitz et al. | 148/175 |
| 3,969,748 | 8/1976 | Horie et al. | 357/46 |
| 4,038,680 | 7/1977 | Yagi et al. | 357/44 |
| 4,260,999 | 4/1981 | Yoshioka | 357/34 |

FOREIGN PATENT DOCUMENTS

| | | | |
|---|---|---|---|
| 0057549 | 8/1982 | European Pat. Off. | 357/34 |
| 0033186 | 8/1980 | Japan | 357/34 |

*Primary Examiner*—Brian E. Hearn
*Assistant Examiner*—William Bunch
*Attorney, Agent, or Firm*—Darby & Darby

[57] ABSTRACT

The present invention relates to a semiconductor device and a method of producing the same. According to this method, a lower diffusion layer of a double isolation diffusion area is attached to a surface of a substrate, an epitaxial layer being formed on the lower diffusion layer, the lower diffusion layer being largely outdiffused upwardly in the epitaxial layer and simultaneously an element diffusion area being deeply diffused from a surface of the epitaxial layer, and then an upper diffusion layer of the double isolation diffusion area being shallowly diffused from the surface of the epitaxial layer. Thus, the lateral expansion of the upper diffusion layer of the double isolation diffusion area can be suppressed and the integrated extent can be improved. On the other hand, in a semiconductor device of the present invention, the above described double isolation diffusion area is formed and a collector area, a base area and an emitter area are formed all over the width of the epitaxial layer (the base area and the emitter area are formed by a double diffusion). In addition, it includes a vertical type transistor whose fluctuation of a width of the base area is reduced, so that the transition frequency $f_T$ and current gain $h_{FE}$ of this transistor are increased.

2 Claims, 25 Drawing Sheets

Proir Art

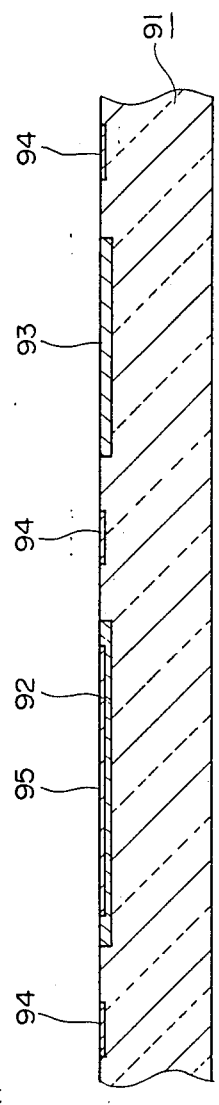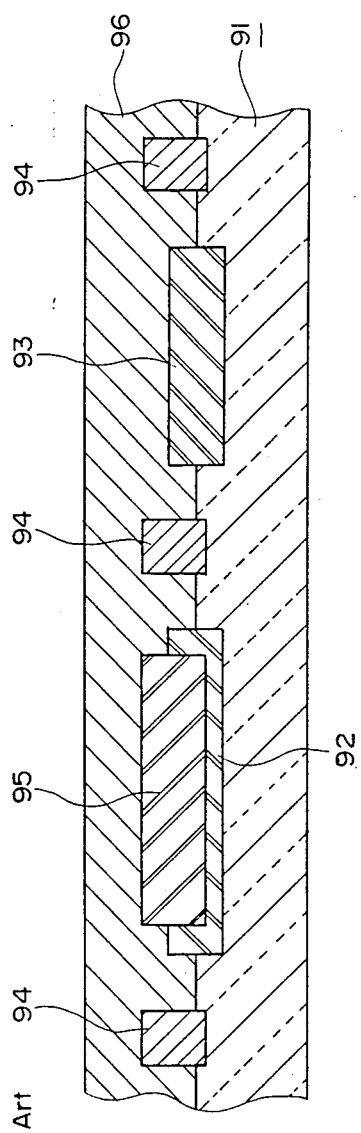
FIG.8(A) Prior Art
FIG.8(B) Prior Art

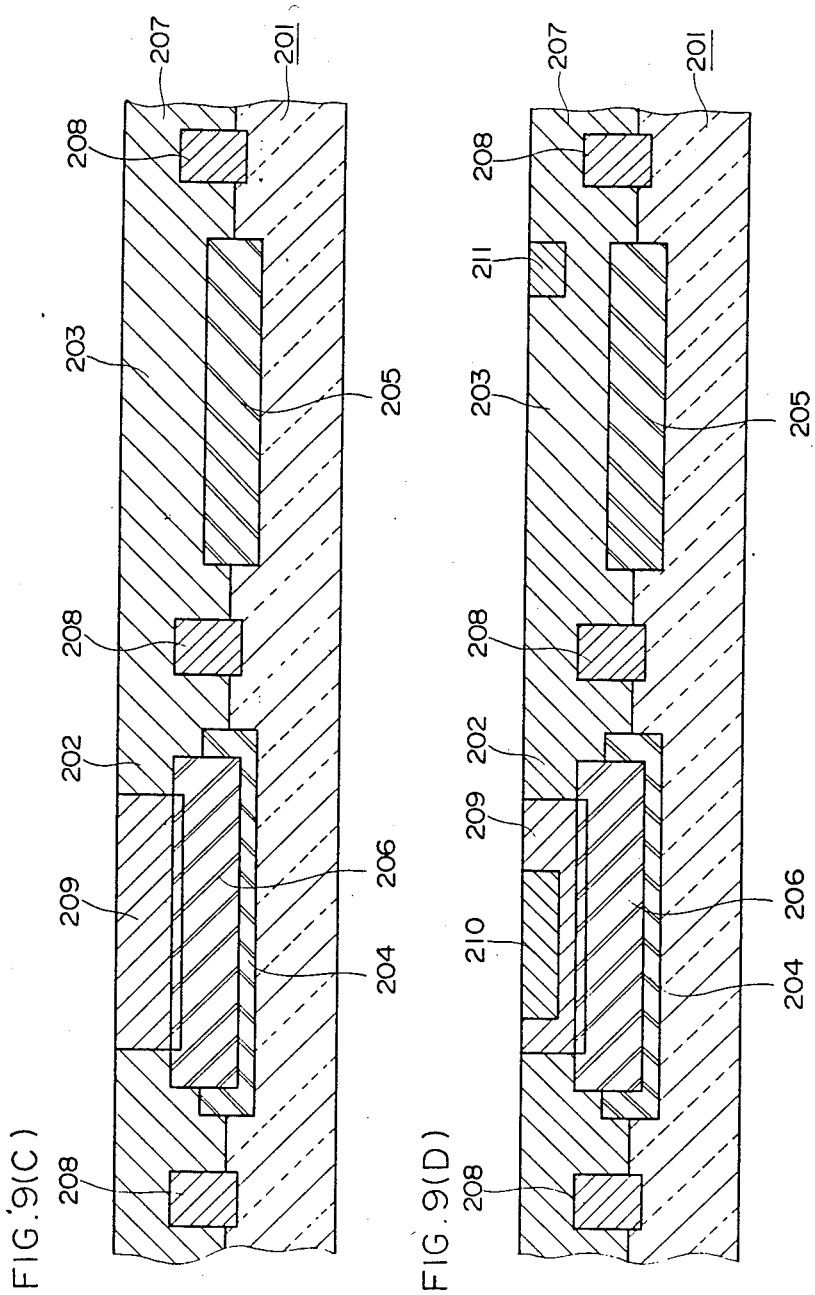

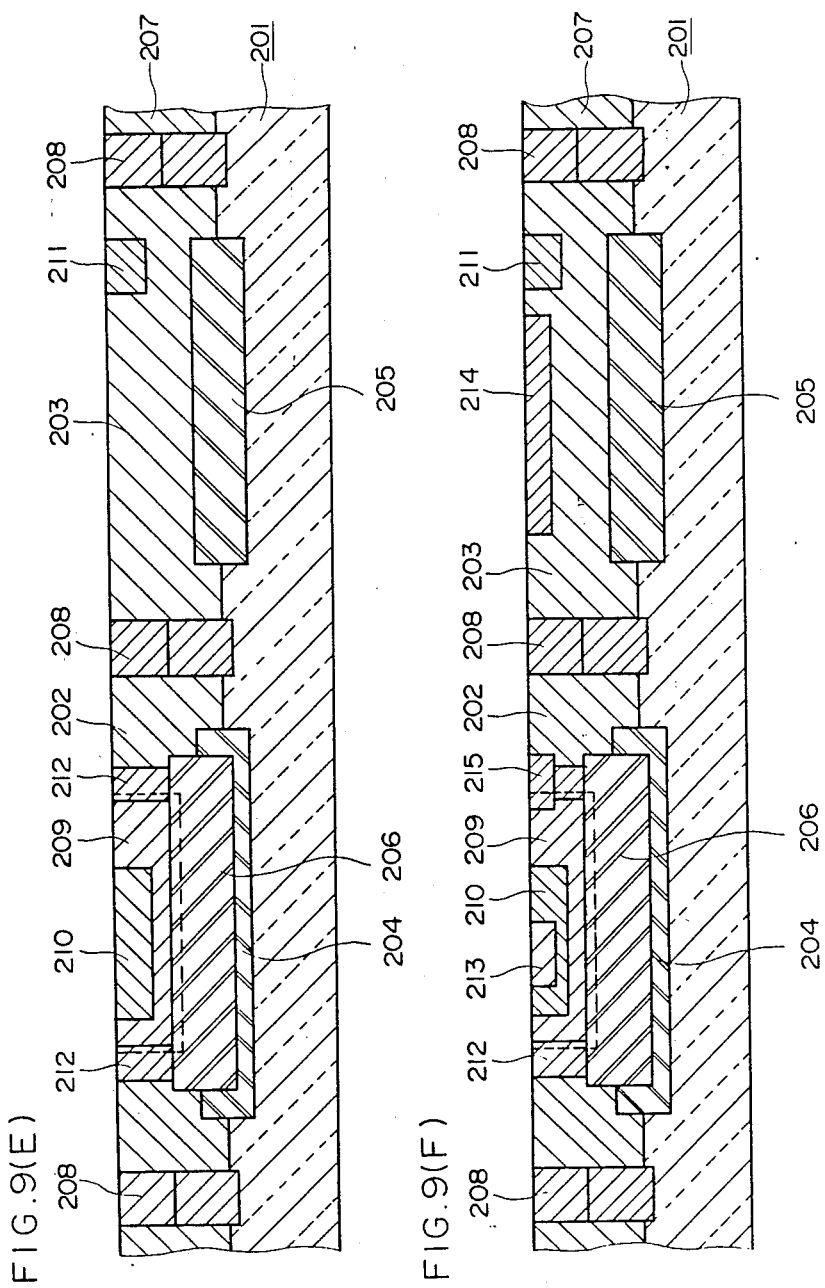

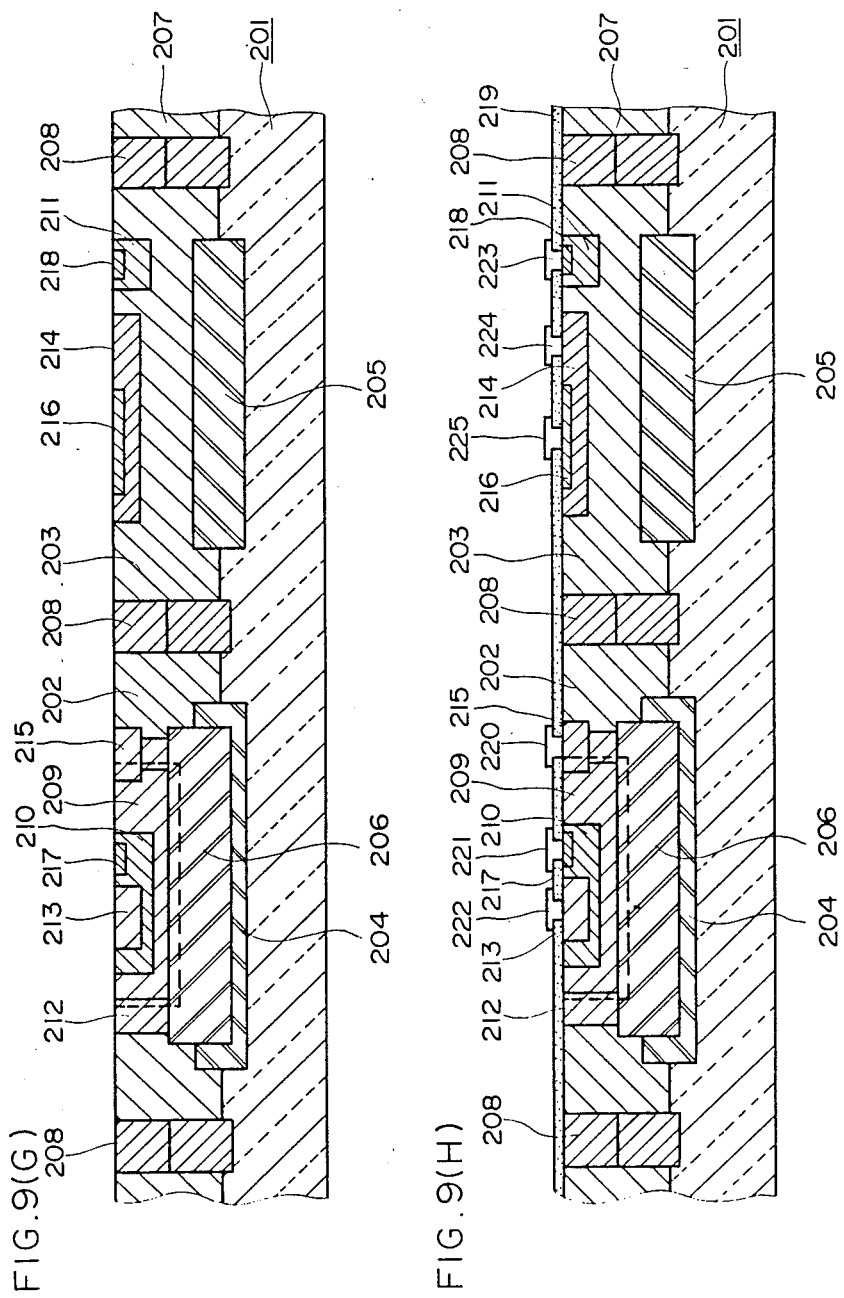

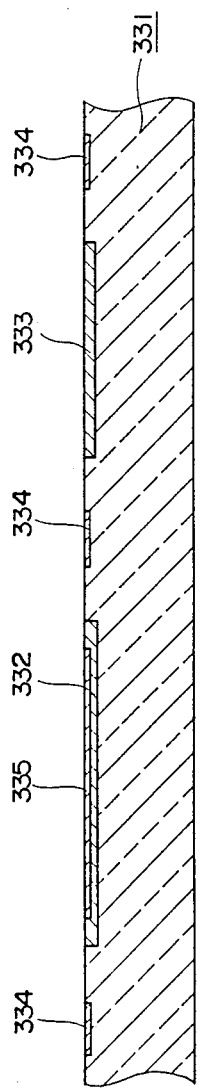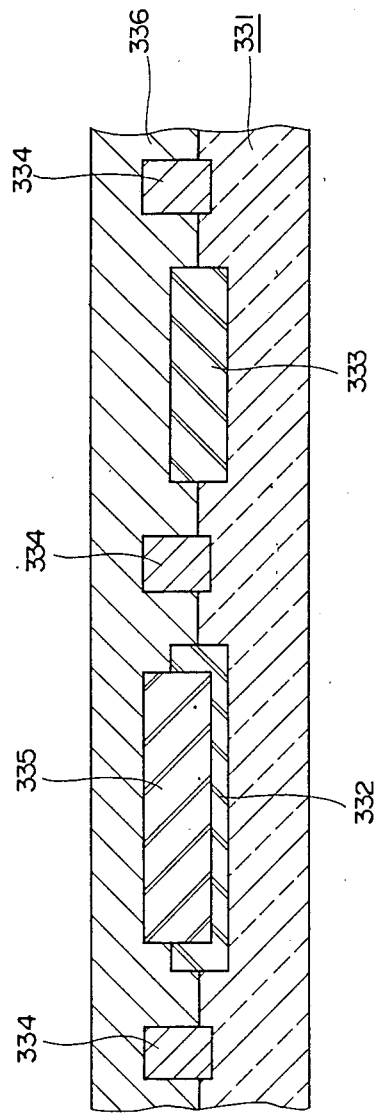
FIG. 10 (A) Proir Art
FIG. 10 (B) Proir Art

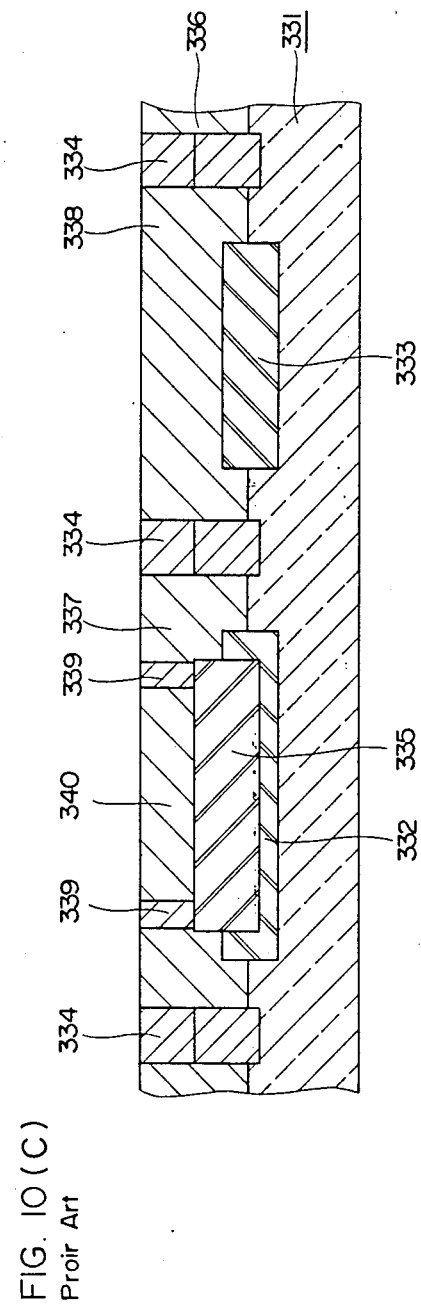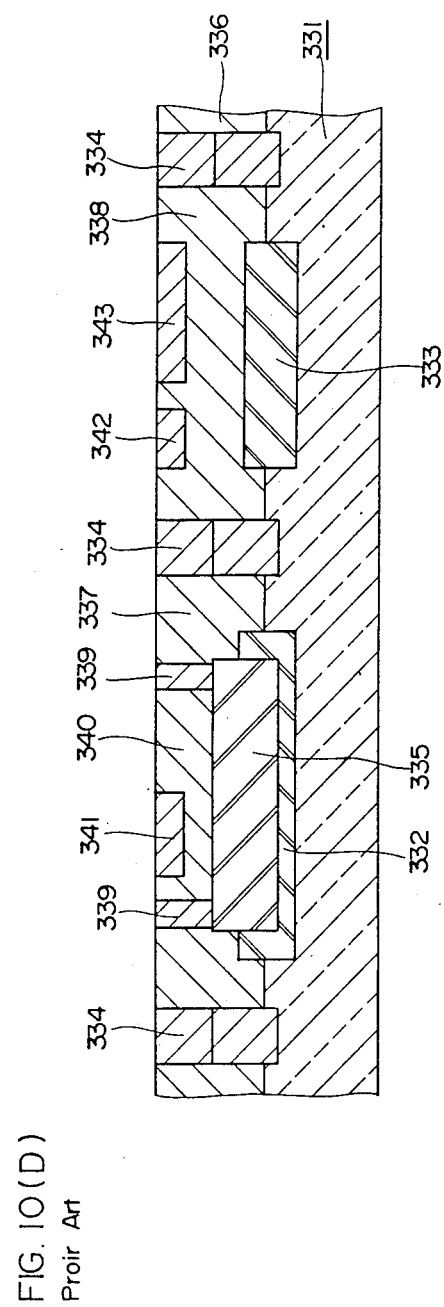
FIG. 10(C) Prior Art
FIG. 10(D) Prior Art

Proir Art

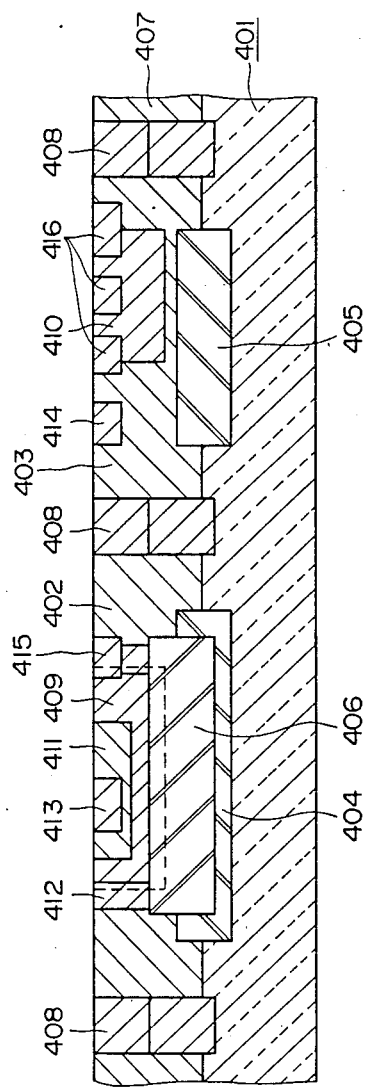
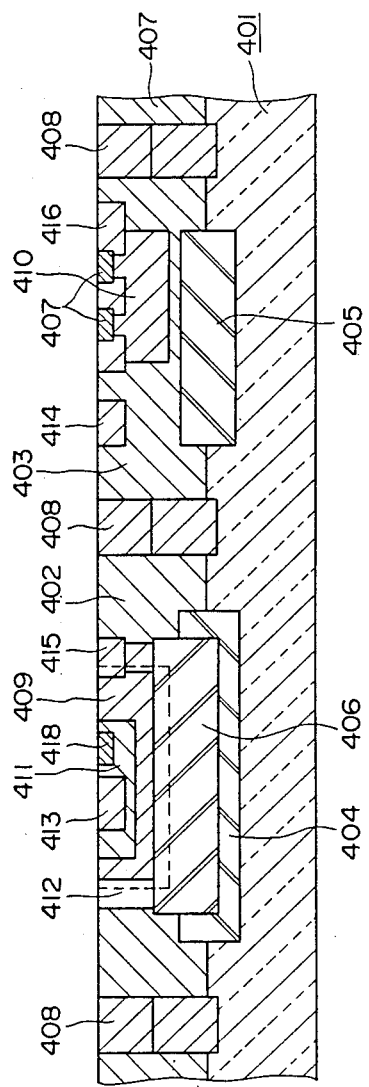
FIG.11(F)
FIG.11(G)

METHOD OF MAKING A BIPOLAR TRANSISTOR WITH DOUBLE DIFFUSED ISOLATION REGIONS

This is a continuation of application Ser. No. 852,231, filed Apr. 15, 1986, now abandoned.

BACKGROUND OF THE INVENTION

1. Field of the Invention

The present invention relates to a semiconductor device and a method of producing the same, in particular to a highly integrated circuit, a vertical type transistor exhibiting high transition frequency and current gain and an integrated circuit containing the transistor therein and a method of producing the same.

2. Description of the Prior Art

A method of producing the conventional NPN transistor will be described with reference to FIG. 1. As shown in FIG. 1(A), a P-type silicon substrate is used as a semiconductor substrate 41, antimony being selectively deposited on a surface of the substrate 41 to form an N+-type buried layer 43, and boron being deposited on a surface of the substrate 41 surrounding the buried layer 43 to form a lower diffusion layer of a double isolation diffusion area 44 (see FIG. 1(D)).

Then, as shown in FIG. 1(B), an N-type epitaxial layer 42 is grown on the substrate 41. Boron is deposited on a surface of the epitaxial layer 42 at positions corresponding to the lower diffusion layer 44′ to form an upper diffusion layer 44″ of the double isolation diffusion area 44.

Subsequently, as shown in FIG. 1(C), the upper diffusion layer 44″ and the lower diffusion layer 44′ of the double isolation diffusion area 44 and the buried layer 43 are diffused in the epitaxial layer 42 by heating the substrate 41, to connect the upper diffusion layer 44″ with the lower diffusion layer 44′, whereby forming the double isolation diffusion area 44. This diffusion process is carried out for 3 to 4 hours at about 1,100° C. If the epitaxial layer 42 is 13 μm thick, the upper diffusion layer 44″ is outdiffused downwardly about 10 μm in depth while the lower diffusion layer 44′ is outdiffused upwardly about 5 μm in depth.

In addition, as shown in FIG. 1(D), a P-type base area 46 and an N-type emitter area 47 are diffused on a surface of an island 45 formed with the epitaxial layer 42 surrounded by the double isolation diffusion area 44, and a collector contact area 48 is diffused on a surface of the island 45 simultaneously with the emitter area 47.

Thus, an NPN transistor is formed in the island 45.

In the case where the isolation area 44 is formed by the downward diffusion and the upward diffusion in the above described manner, the diffusion time is shorter than that in the conventional method in which the isolation area is formed by diffusing only from the upper side since the upper diffusion layer 44″ contains impurities at a higher ratio, but since the upper diffusion layer 44″ is to be diffused thicker than the lower diffusion layer 44′, it is necessary to diffuse the former thicker than the latter and thus, a lateral diffusion is increased. In short, an area to be occupied by the upper diffusion layer 44″ in the epitaxial layer 42 is large, whereby the integrated extent is prevented from being improved.

On the other hand, the vertical type PNP transistor has the problems described below:

The conventional vertical type PNP transistor, as shown in FIG. 2, comprises an N-type epitaxial layer 52 grown on a surface of a P-type silicon semiconductor substrate 51, an N+-type buried layer 53 formed on the substrate 51, a double isolation diffusion area 54 passing through the epitaxial layer 52 so as to completely surround the buried layer 53, a P+-type collector area 55 overlaid on the buried layer 53 of the substrate 51, a P+-type collector-leading area 56 extending to the collector area 55 from a surface of the epitaxial layer 52, a base area 57 completely surrounded by the collector area 55 and the collector-leading area 56 and formed of the epitaxial layer 52, a P+-type emitter area 58 formed on a surface of the base area 57, an oxidized film 59 covering a surface of the epitaxial layer 52, and a collector electrode 61, a base electrode 62 and an emitter electrode 63 being brought into ohmic contact with the collector-leading area 56, the base contact area 60 and the emitter area 58, respectively, through an electrode hole of the oxidized film 59. Such a vertical type PNP transistor has been disclosed in, for example, Japanese Patent Laid-Open No. 59-172738 (1984). In this construction, since the base area 57 is formed of the epitaxial layer 52, the concentration of impurities is low to an extent of $10^{16}$ cm$^{-3}$ or less, and since a breadth size (a size in the direction of thickness) is large, a defect has been that the transition frequency $f_T$ is low. In addition, since the specific resistance and the thickness of the epitaxial layer 52 are apt to fluctuate and this fluctuation results from the fluctuation of the base area 57 in concentration of impurities and breadth size, a defect has been that the current gain $h_{FE}$ of the PNP transistor fluctuates due to such a fluctuation.

A vertical type PNP transistor, in which such a defect was eliminated, is shown in FIG. 3. This vertical type PNP transistor is provided with a P-type silicon semiconductor substrate 71, an N-type epitaxial layer 72 formed on the substrate 71, an N+-type buried layer 73 formed on the substrate 71, a P+-type double isolation diffusion area 74 passing through the epitaxial layer 72 so as to completely surround the buried layer 73, a P+-type collector area 75 formed on the buried layer 73, a P+-type collector-leading area 76 extending from a surface of the epitaxial layer 72 to the collector area 75, a base area 77 completely surrounded by the collector area 75 and the collector-leading area 76 and formed of the epitaxial layer 72, a P+-type emitter area 78 formed on a surface of the base area 77, an N+-type base contact area 80 formed on a surface of the base area 77, an oxidized film 79 covering a surface of the epitaxial layer 72, a collector electrode 81, a base electrode 82 and an emitter electrode 83 being brought into ohmic contact with the collector-leading area 76, the base contact area 80 and the emitter area 78, respectively, through an electrode hole of this oxidized film 79, and an N-type ion implantation area 84 having the concentration of impurities higher than that of the base area 77 formed on a surface of the base area 77.

Referring to FIG. 4, which is a profile showing the concentration of impurities in this transistor, the concentration of impurities of the N-type ion implantation area 84 formed on a surface of the epitaxial layer 72 is about 10 times higher than that of the epitaxial layer 72. The base area 77 is composed of the epitaxial layer 72 and the ion implantation area 84. Accordingly, since the concentration of impurities in the base area 77 is tend to be reduced from the emitter area 78 to the collector area 75, a drift electric field is generated within the base area 77, whereby accelerating a hole. As a result, the transition frequency $f_T$ of a vertical type PNP transistor shown in FIG. 3, which is 100 MHz, is remarkably higher than that of a transistor shown in FIG. 2 which is 50 MHz.

In addition, since the $h_{FE}$ of a vertical type PNP transistor is almost determined by the depth of the ion implantation area 84 even though the thickness and specific resistance of the epitaxial layer 72 fluctuate, the fluctuation of $h_{FE}$ is remarkably reduced by the ion implantation. Concretely speaking, it becomes about ½ time reduced than that in the conventional one. But, since the breadth size of the base area 77 is large, the improvement of the transition frequency $f_T$ is limited. In addition, the fluctuation of $h_{FE}$ due to the fluctuation of the epitaxial layer 72 in thickness cannot be evitable. Furthermore, since the concentration of impurities in the collector area 75 is small to an extent of $10^{17}$ cm$^{-3}$, a defect occurs that the collector emitter saturated voltage $V_{CE\ (sat)}$ is large.

SUMMARY OF THE INVENTION

A first object of the present invention is to provide a highly integrated semiconductor integrated circuit, in which the lateral expansion of an upper diffusion layer of a double isolation diffusion area is suppressed by diffusing simultaneously a lower diffusion layer of the double isolation diffusion area and an element diffusion area thickly and then diffusing the upper diffusion layer of the double isolation diffusion area and a method of producing the same.

A second object of the present invention is to provide a highly integrated semiconductor integrated circuit (including a vertical type transistor), in addition to suppressing the lateral expansion of the double isolation diffusion area in the above described manner, increasing and stabilizing the integrated extent and the $f_T$ and $h_{FE}$ by forming a collector area, a base area and an emitter area in turn in an epitaxial layer formed on a substrate by the diffusion to reduce and unify a breadth size of the base area and a method of producing the same.

A third object of the present invention is to provide a vertical type transistor, in which the $f_T$ and $h_{FE}$ can be increased and stabilized and further $V_{CE}$ can be reduced by forming a collector area, a base area and an emitter area in turn in an epitaxial layer formed on a substrate by the diffusion to reduce and unify a breadth size of the base area and a method of producing the same.

A fourth object of the present invention is to provide a method of producing a complementary transistor and an integrated injection logic provided with a vertical type transistor, in which, in addition to suppressing the lateral expansion of a double isolation diffusion area and increasing the integrated extent, in the above described manner, increasing and stabilizing the $f_T$ and $h_{FE}$ by reducing and unifying the breadth size of a base area.

A fifth object of the present invention is to provide a method of producing a complementary transistor and an integrated injection logic provided with a vertical type transistor, in which the $f_T$ and $h_{FE}$ are increased and stabilized by reducing and unifying the breadth size of a base area in the above described manner.

The above and further objects and features of the invention will more fully be apparent from the following detailed description with accompanying drawings.

BRIEF DESCRIPTION OF THE DRAWINGS

FIGS. 8(A)-(E) are sectional construction drawings for illustrating a method of producing the conventional complementary transistor, FIGS. 9(A)-(H) are sectional construction drawings for illustrating the fourth embodiment of the present invention, FIGS. 10(A)-(E) are sectional construction drawings for illustrating a method of producing the conventional semiconductor integrated circuit, and FIGS. 11(A)-(H) are sectional construction drawings for illustrating the fifth embodiment of the present invention.

DESCRIPTION OF THE PREFERRED EMBODIMENT

The present invention will be described below in detail with reference to the drawings showing the preferred embodiments.

FIGS. 5(A)-(E) show a process for producing an NPN transistor.

Figure 1A:
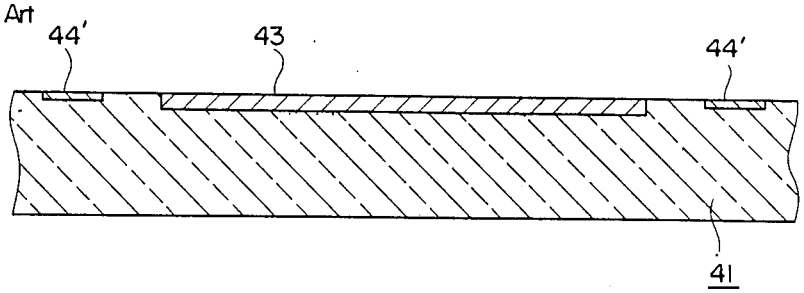
FIGS. 1(A)-(D) are sectional construction drawings for illustrating a method of producing the conventional NPN transistor.
Figure 1B:
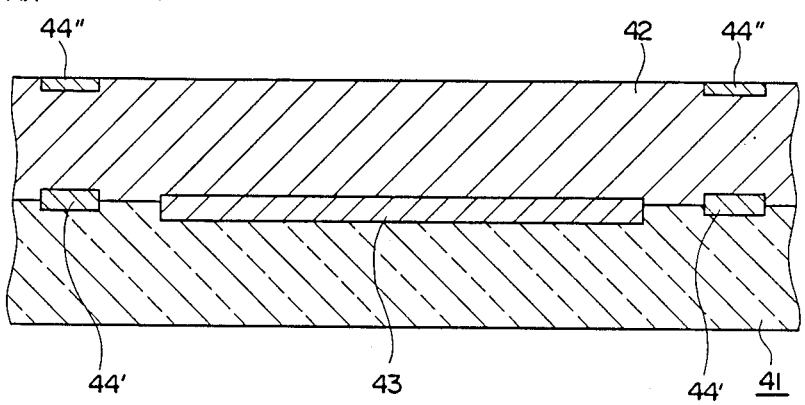
Figure 1C:
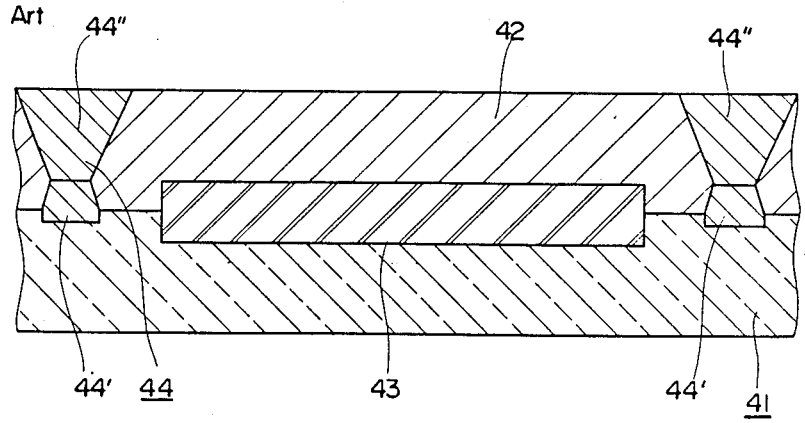
Figure 1D:
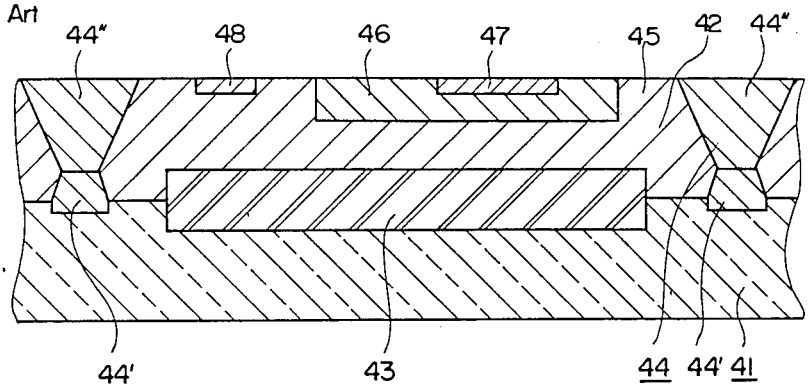
Figure 2:
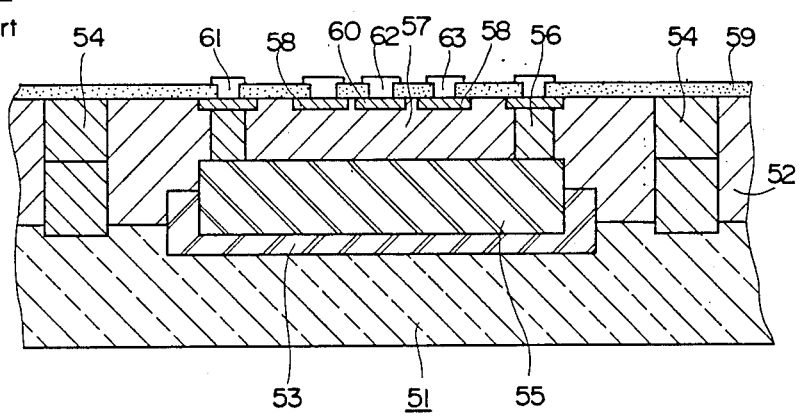
FIGS. 2, 3 are sectional construction drawings showing the conventional vertical type PNP transistor.
Figure 3:
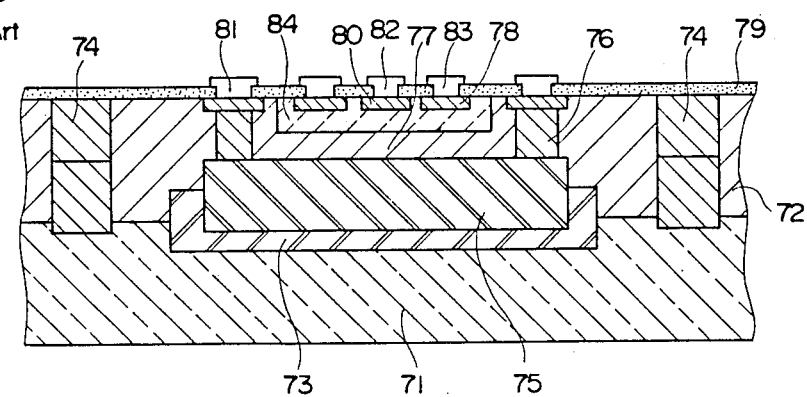
Figure 4:
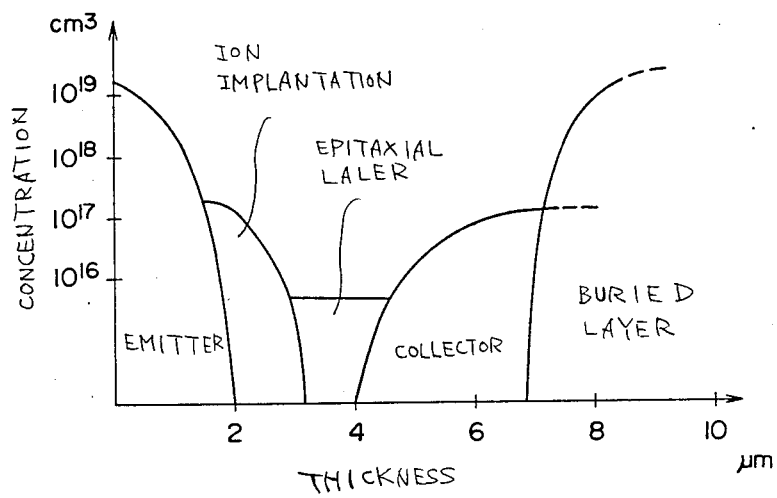
FIG. 4 is a profile showing the concentration of impurities in a vertical type PNP transistor shown in FIG. 3, FIGS. 5(A)-(E) are sectional construction drawings for illustrating a method of producing a semiconductor integrated circuit according to the present invention.
Figure 5A:
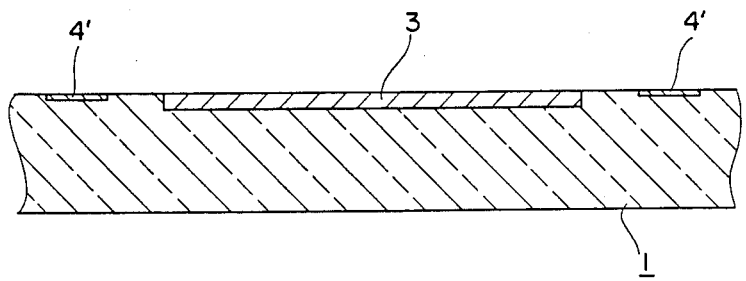
Figure 5:
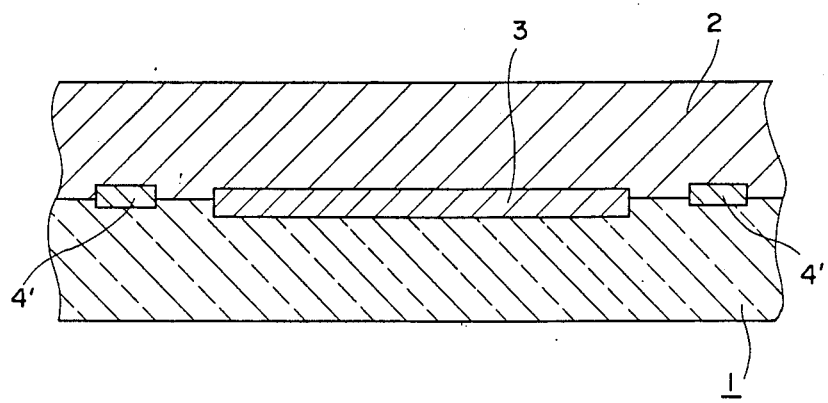
Figure 5:
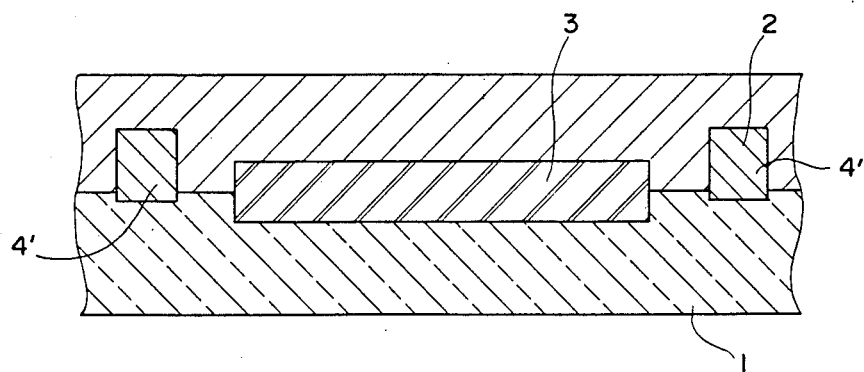

At first, as shown in FIG. 5(A), a P-type silicon substrate is used as a semiconductor substrate 1, antimony being selectively deposited on a surface of the substrate 1 to form an N+-type buried layer 3, and boron being deposited on a surface of the substrate 1 surrounding the buried layer 3 to form a lower diffusion layer 4' of a double isolation diffusion area 4.

Next, as shown in FIG. 5(B), an N-type epitaxial layer 2 having a thickness of about 7 μm is grown on the substrate 1. In this time, the buried layer 3 and the lower diffusion layer 4' of the double isolation diffusion area 4 are slightly diffused both upward and downward. Concretely speaking, the lower diffusion layer 4' of the double isolation diffusion area 4 is outdiffused upwardly about 1.5 μm.

Next, as shown in FIG. 5(C), the whole substrate 1 is heated at about 1,200° C. to outdiffuse the lower diffusion layer 4' of the double isolation diffusion area 4 and the buried layer 3 upwardly into the epitaxial layer 2. Concretely speaking, the lower diffusion layer 4' of the double isolation diffusion area 4 is outdiffused upwardly about 5 μm from a lower surface of the epitaxial layer 2. This diffusion requires 2 to 3 hours.

Figure 5D:
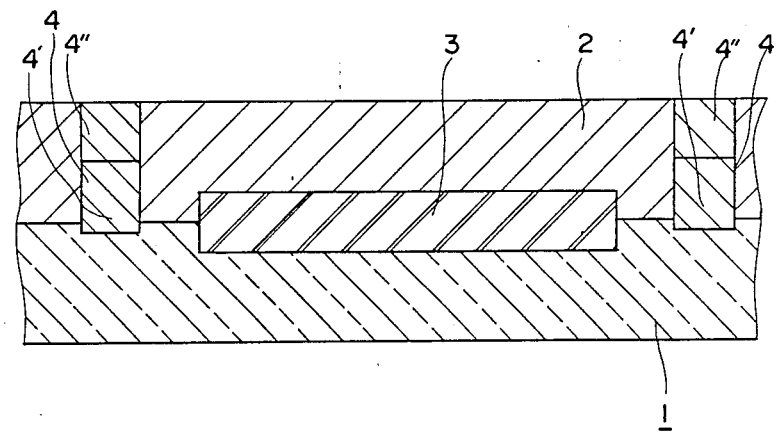

Next, as shown in FIG. 5(D), an upper diffusion layer 4" of the double isolation diffusion area 4 is diffused from a surface of the epitaxial layer 2 to connect the lower diffusion layer 4', whereby isolating the epitaxial layer 2.

This process is a process by which the present invention is characterized, and the lower diffusion layer 4' of the double isolation diffusion area 4 is sufficiently outdiffused upwardly and then the upper diffusion layer 4" is diffused, so that the depth of the upper diffusion layer 4" can be reduced to about 3 μm and the diffusion time of the upper diffusion layer 4" can be reduced to one hour at about 1,200° C. Accordingly, the lateral diffusion of the upper diffusion layer 4" can be remarkably reduced within about 3 μm from a peripheral end of a diffusion hole and an area to be occupied by the upper diffusion layer 4" can be remarkably reduced.

Figure 5E:
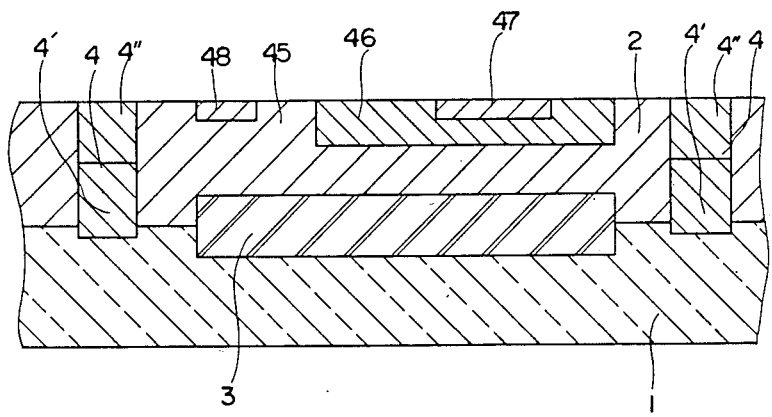

Next, as shown in FIG. 5(E), a P-type base area 46 and an N-type emitter area 47 are diffused on a surface of an island 45 formed with the epitaxial layer 2 surrounded by the double isolation diffusion area 4. In addition, a collector contact area 48 is formed on a surface of the island 45 simultaneously with the emitter area 47. Thus, an NPN transistor using the epitaxial layer 2 as a collector is formed on the island 45.

As described above, according to a method of the present invention, since the lower diffusion layer 4' and the upper diffusion layer 4" are diffused in turn, the upper diffusion layer 4" can be reduced more than the lower diffusion layer 4' in thickness, whereby being reduced the lateral expansion of the upper diffusion layer 4" and improving the integrated extent.

Figure 6A:
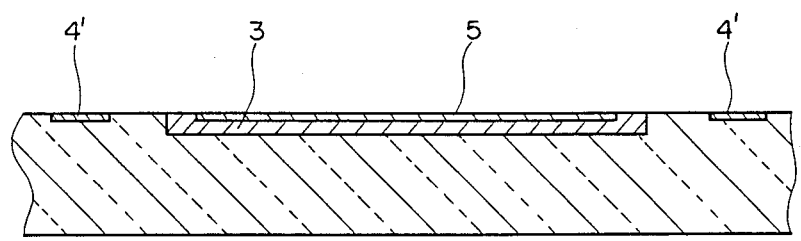
FIGS. 6(A)-(F) are sectional construction drawings for illustrating the second embodiment of the present invention.

At first, referring to FIG. 6(A) of FIGS. 6(A)–(F) for illustrating the second embodiment of a method according to the present invention, a P-type silicon substrate is used as a semiconductor substrate 1, antimony being selectively deposited on a surface of the substrate 1 to form an N+-type buried layer 3, and boron being deposited on the buried layer 3 and a surface of the substrate 1 surrounding the buried layer 3 to form a collector buried layer 5 and a lower diffusion layer 4' of a double isolation diffusion area 4.

Figure 6B:
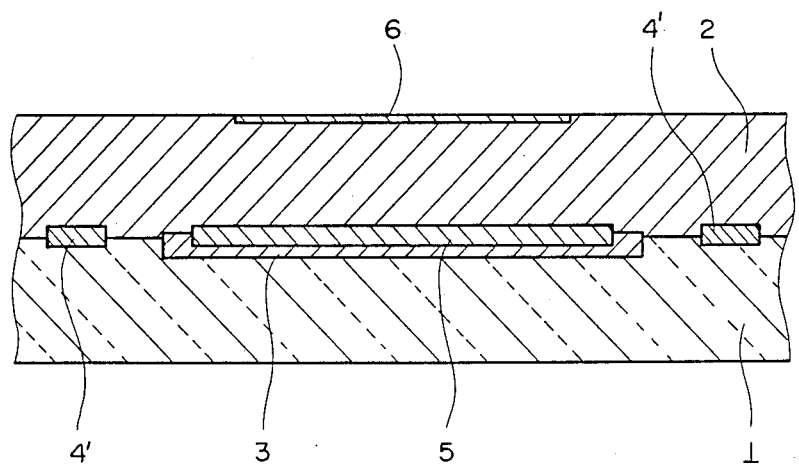

Next, as shown in FIG. 6(B), an N-type epitaxial layer 2 of about 7 μm thick is grown on the substrate 1. Simultaneously, the buried layer 3, the collector buried layer 5 and the lower diffusion layer 4' of the double isolation diffusion area 4 are slightly outdiffused downwardly and upwardly. Concretely speaking, the lower diffusion layer 4' of the double isolation diffusion area 4 and the collector buried layer 5 are outdiffused upwardly about 1.5 μm. In this process, boron is selectively ion implanted in an area of a surface of the epitaxial layer 2 corresponding to the collector buried layer 5 to attach the collector area 6, which is one of element diffusion areas, to the epitaxial layer 2. This ion implantation is carried out at a boron dose of $10^{13}$ to $10^{15}$ cm$^{-2}$ and an accelerating voltage of 80–200 keV.

Figure 6C:
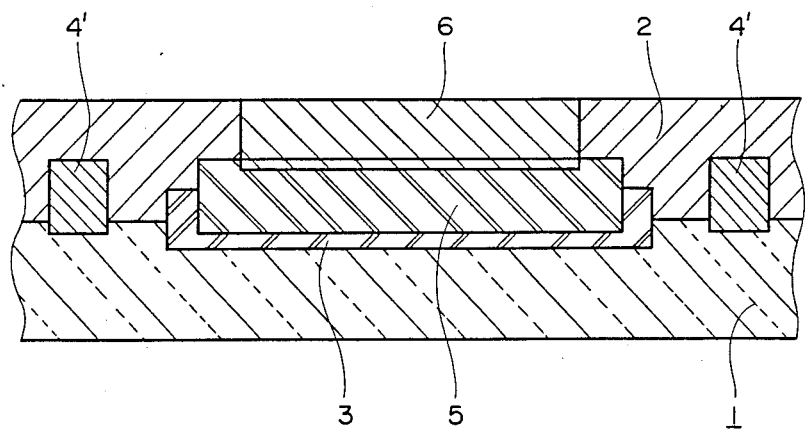

Subsequently, as shown in FIG. 6(C), the whole substrate 1 is heated at about 1,200° C. to outdiffuse upwardly the lower diffusion layer 4' of the double isolation diffusion area 4, the buried layer 3 and the collector buried layer 5 into the epitaxial layer 2, and simultaneously diffuse the collector area 6 deeply into the epitaxial layer 2. Concretely speaking, the lower diffusion layer 4' of the double isolation diffusion area 4 and the collector buried layer 5 are outdiffused upwardly about 5 μm from the lower surface of the epitaxial layer 2 while the collector area 6 is driven in to the epitaxial layer 2 to the depth of about 4 μm from a surface of the epitaxial layer 2. Accordingly, the collector area 6 completely extends to the collector buried layer 5. This diffusion requires 2 to 3 hours.

Figure 6D:
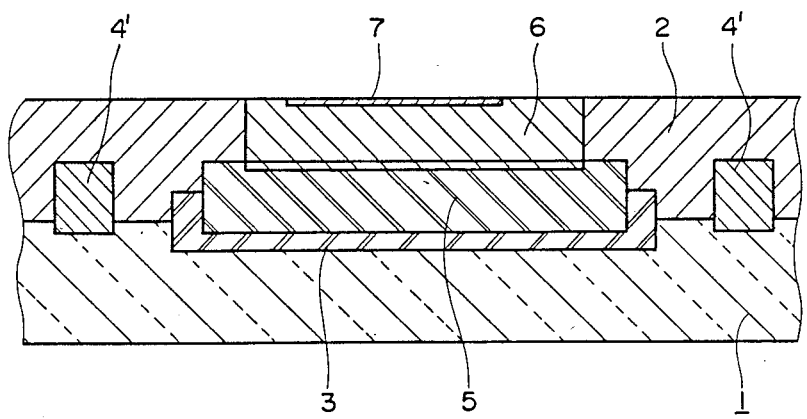

Further, as shown in FIG. 6(D), phosphor is ion implanted into a surface of the collector area 6 to form a base area 7. This ion implantation is carried out at a phosphor dose of $10^{15}$ to $10^{17}$ cm$^{-2}$ and an accelerating voltage of 60 to 100 keV to attach the base area 7 to a surface of the collector area 6.

Figure 6E:
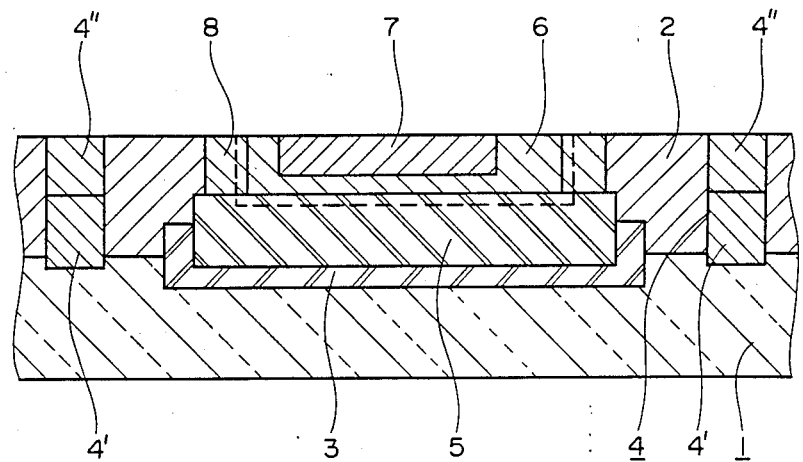

Next, as shown in FIG. 6(E), an upper diffusion layer 4" of the double isolation diffusion area 4 and a collector-leading area 8 are simultaneously diffused from a surface of the epitaxial layer 2, to connect the lower diffusion layer 4' with the upper diffusion layer 4", whereby isolating the epitaxial layer 2. In addition, this collector-leading area 8 extends to the collector buried layer 5 and surrounds the collector area 6 along all periphery thereof. Furthermore, in this diffusion process the base area 7, which was formed in the preceding process, is driven in to form the base area 7 having a depth of about 2.5 μm.

This process is a process by which the present invention is characterized, and since the lower diffusion layer 4' of the double isolation diffusion area 4 is sufficiently outdiffused upwardly and then the upper diffusion layer 4" is diffused, the depth of the upper diffusion layer 4" can be reduced to an extent of about 3 μm and the diffusion time of the upper diffusion layer 4" can be reduced to one hour at about 1,200° C. Thus, the lateral diffusion of the upper diffusion layer 4" can be remarkably reduced within about 3 μm from a peripheral end of a diffusion hole and an area to be occupied by the upper diffusion layer 4" can be remarkably reduced.

Figure 6F:
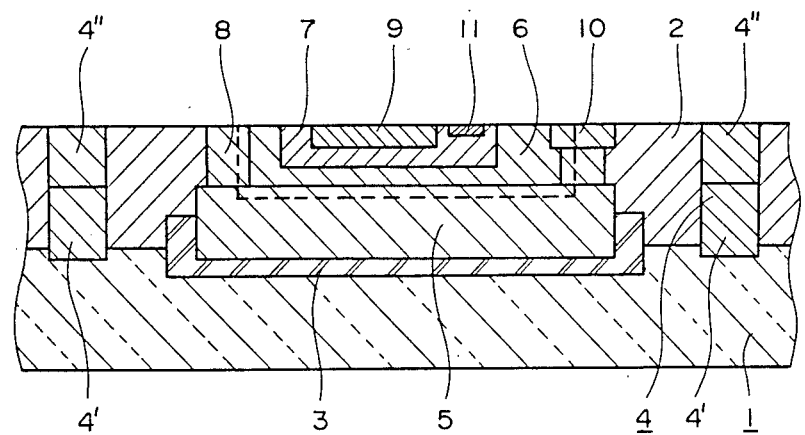

In addition, as shown in FIG. 6(F), an emitter area 9 and a collector contact area 10 are diffused on a surface of the base area 7 and a surface of the collector-leading area 8, respectively. Subsequently, a base contact area 11 is formed on a surface of the base area 7 by the diffusion. The emitter area 9 is about 2 μm in depth and the base contact area 11 is about 1.5 μm in depth.

As described above, according to a method of the present invention, the lateral expansion of the upper diffusion layer 4" can be reduced and the integrated extent can be improved by reducing the thickness of the upper diffusion layer 4".

In addition, since the base area and the emitter area are all formed by the diffusion, the desired values of a breadth size and a concentration of impurities of the base area can be obtained in high accuracy. Accordingly, according to the present invention, the transition frequency $f_T$ and the current gain $h_{FE}$ can be increased and stabilized in comparison with those in the conventional methods. Incidentally, the $f_T$ of 200 MHz could be achieved.

Next, the third embodiment of a method of producing a semiconductor integrated circuit according to the present invention is described in detail with reference to FIGS. 7(A)–(F).

Figure 7A:
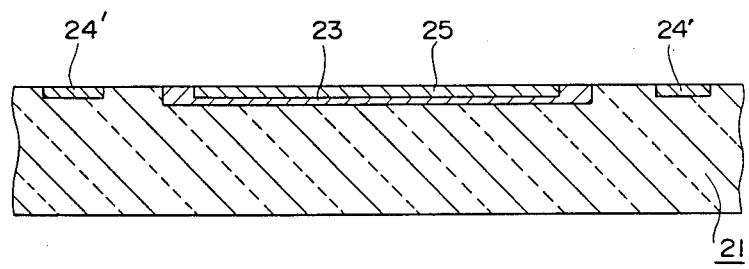
FIGS. 7(A)-(F) are sectional construction drawings for illustrating the third embodiment of the present invention.

At first, as shown in FIG. 7(A), a P-type silicon substrate is used as a semiconductor substrate 21, antimony being selectively deposited on the substrate 21 to form an N+-type buried layer 23, and boron being deposited on the buried layer 23 and a surface of the substrate 21 surrounding the buried layer 23 to form a collector buried layer 25 and a lower diffusion layer 24' of a double isolation diffusion area 24.

Figure 7B:
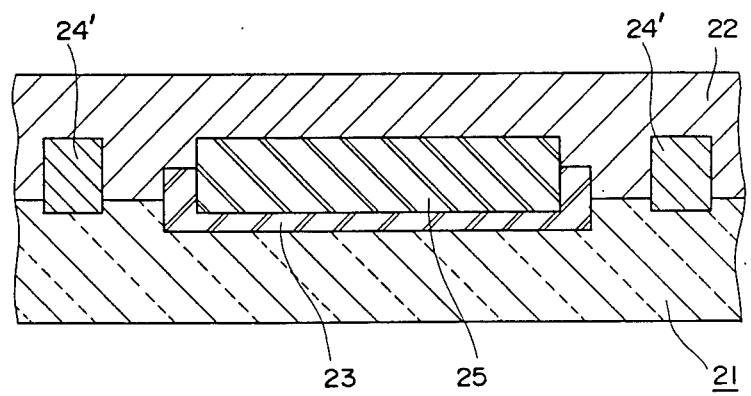

Next, as shown in FIG. 7(B), an epitaxial layer 22 having a thickness of about 7 μm is grown on the substrate 21. Then, the substrate 21 is heated to diffuse the buried layer 23, the collector buried layer 25 and the lower diffusion layer 24' of the double isolation diffusion area 24, whereby forming the buried layer 23 and the collector buried layer 25 having the desired width. Concretely speaking, the lower diffusion layer 24' of the double isolation diffusion area 24 is outdiffused upwardly about 5 μm from a lower surface of the epitaxial layer 22.

Figure 7C:
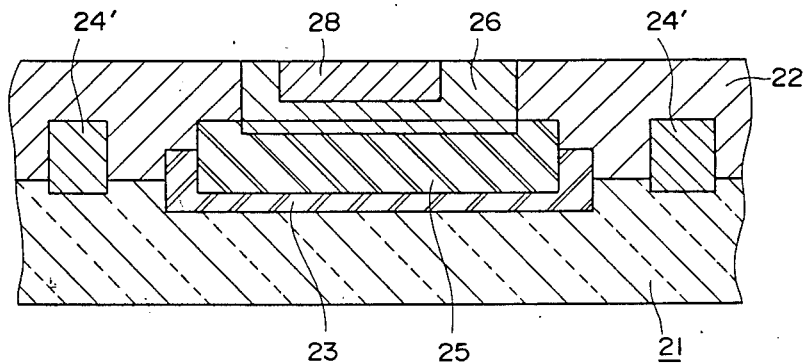

In succession, as shown in FIG. 7(C), a collector area 26 is formed by an ion implantation by which the present invention is characterized. This ion implantation is carried out at a boron dose of $10^{13}$ to $10^{15}$ cm$^{-2}$ and an accelerating voltage of 80 to 200 keV. Impurities ion implanted into a surface of the epitaxial layer 22 formed on the collector buried layer 25 are driven in to the depth of about 4 μm so as to arrive at the collector buried layer 25. The driving-in process is advantageously carried out simultaneously with the above described diffusion process of the lower diffusion layer 24′ of the double isolation diffusion area 24.

In addition, phosphor is ion implanted into a surface of the collector area 26 to form a base area 28. This ion implantation is carried out at a phosphor dose of $10^{15}$ to $10^{17}$ cm$^{-2}$ and an accelerating voltage of 60 to 100 keV. Phosphor is driven in to a depth of about 2.5 μm to form a base area 28. In addition, the driving-in process of the base area 28 is advantageously carried out simultaneously with the subsequent diffusion process of the upper diffusion layer 24″ of the double isolation diffusion area 24.

Figure 7D:
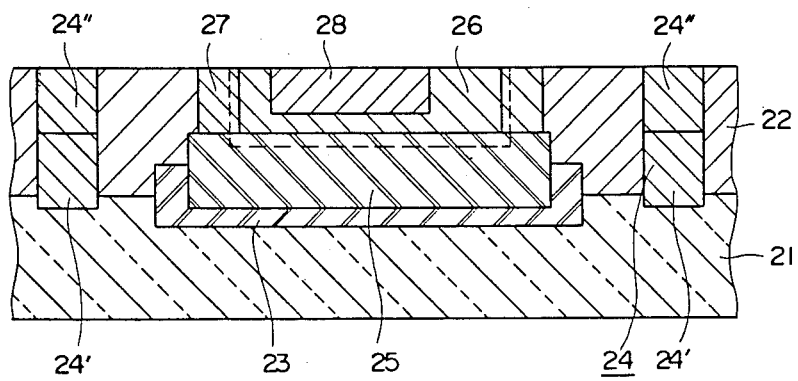

In addition, as shown in FIG. 7(D), the upper diffusion layer 24″ of the double isolation diffusion area 24 and a collector-leading area 27 are simultaneously diffused from a surface of the epitaxial layer 22, to connect the lower diffusion layer 24′ with the upper diffusion layer 24″, whereby isolating the epitaxial layer 22. This collectorleading area 27 extends to the collector buried layer 25 and surrounds the whole periphery of the collector area 26. Concretely speaking, the depth of the upper diffusion layer 24″ is about 3 μm after the diffusion for one hour at about 1,200° C.

Figure 7E:
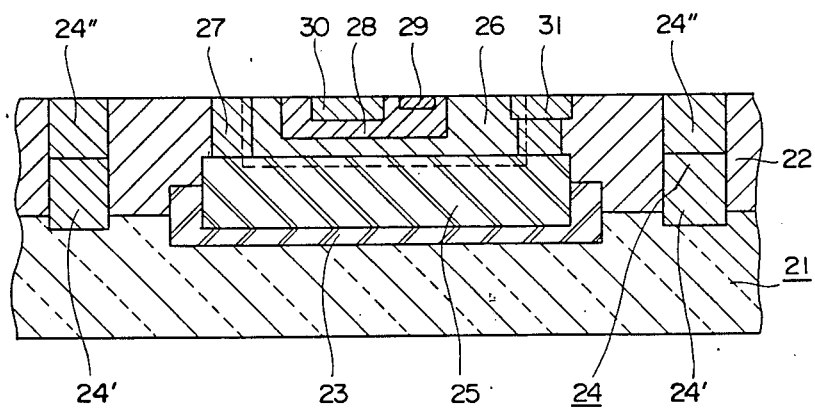

In addition, as shown in FIG. 7(E), an emitter area 30 and a collector contact area 31 are diffused on a surface of the base area 28 and a surface of the collector-leading area 27, respectively. Then, a base contact area 29 is formed on a surface of the base area 28. Concretely speaking, the base area 28 is formed about 2.5 μm in depth, the emitter area 30 about 2 μm, and the base contact area 29 about 1.5 μm.

Figure 7F:
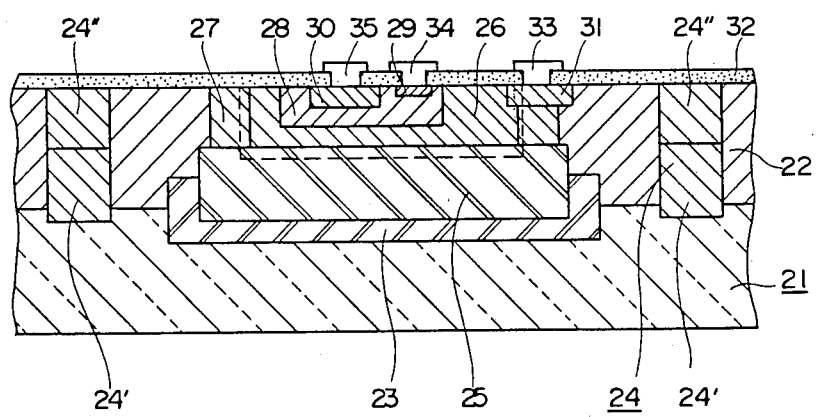

In addition, as shown in FIG. 7(F), a collector electrode 33, a base electrode 34 and an emitter electrode 35 are formed of vapored aluminum by the well-known vapor coating technique.

A vertical type PNP transistor produced by a producing method according to the present invention described above comprises a P-type silicon semiconductor substrate 21, an N-type epitaxial layer 22 formed on the substrate 21, an N+-type buried layer 23 formed on the substrate 21, a P+-type double isolation diffusion area 24 passing through the epitaxial layer 22 so as to completely surround the buried layer 23, a P+-type collector buried layer 25 formed on the buried layer 23, a P-type collector area 26 formed by the ion implantation, extending from a surface of the epitaxial layer 22 to the collector buried layer 25, a P+-type collector-leading area 27 extending from a surface of the epitaxial layer 22 to the collector buried layer 25, an N-type base area 28 formed on a surface of the collector area 26 by the ion implantation, an N+-type base contact area 29 formed on a surface of the base area 28, a P-type emitter area 30 formed on a surface of the base area 28, a P+-type collector contact area 31 formed in layers on a surface of the collectorleading area 27, an oxidized film 32 covering a surface of the epitaxial layer 22 and a collector electrode 33, a base electrode 34 and an emitter electrode 35 being brought into ohmic contact with the collector contact area 31, the base contact area 29 and the emitter area 30, respectively, through a contact hole formed in the oxidized film 32.

In this embodiment, since a base area and an emitter area are formed by the double diffusion on a collector area formed by the ion implantation and the diffusion, the fluctuation of $f_T$ and $h_{FE}$ can be reduced, a breadth size of a base can be reduced, and $f_T$ and $h_{FE}$ can be increased in comparison with the first embodiment.

In addition, in this embodiment, since a collector area is formed by the ion implantation and the diffusion, the concentration of impurities can be stabilized to an extent of $10^{16}$ to $10^{17}$ cm$^{-3}$ and the collector emitter saturated voltage $V_{CE(sat)}$ can be reduced. And, since a collector buried layer 25 is sufficiently outdiffused upward, a collector area 26 can be sufficiently extended to a collector buried layer 25. In addition, since a collector area 26 is sufficiently surrounded by a collector buried layer 25 and a collector-leading area 27, $V_{CE(sat)}$ can be still more reduced.

While the third embodiment relates to a complementary transistor, prior to its description, a method of producing the conventional complementary transistor is described with reference to FIGS. 8(A)–(E).

At first, as shown in FIG. 8(A), an N+-type buried layer 92 and an N+-type buried layer 93 are formed by the diffusion on a portion corresponding to an intended first island and an intended second island, respectively, on a surface of a P-type semiconductor substrate 91, and the lower diffusion of a double isolation diffusion area 94 is carried out so as to surround the buried layers 92, 93. In addition, a P+-type collector buried layer 95 is overlaid by the diffusion on the buried layer 92 in the first island.

Next, as shown in FIG. 8(B), an N-type epitaxial layer 96 is grown on a surface of the substrate 91. In this time, the buried layers 92, 93, the collector buried layer 95 and the lower diffusion layer of the double isolation diffusion area 94 are diffused both upward and downward, to form the buried layers 92, 93 and the collector buried layer 95 having the desired width.

Figures 8C, 8D:
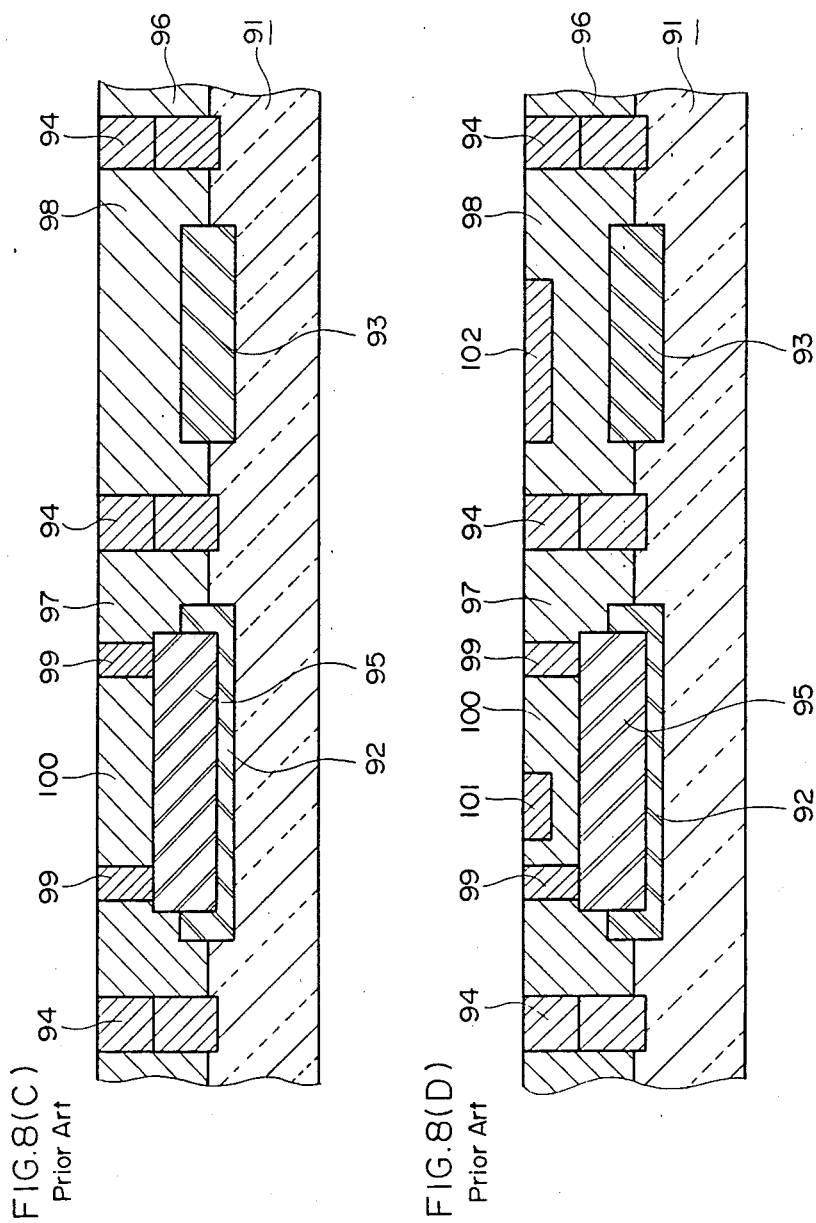

Next, as shown in FIG. 8(C), an upper diffusion of the double isolation diffusion area 94 and a collector-leading area 99 are simultaneously diffused on the first island 97 from a surface of the epitaxial layer 96, to contact the lower diffusion layer of the double isolation diffusion area 94 with the upper diffusion layer of the double isolation diffusion area 94, whereby isolating the epitaxial layer 96 and forming the first island 97 and the second island 98. In addition, the collector-leading area 99 extends to the collector buried layer 95 of a PNP transistor within the first island 97 and completely surrounds the epitaxial layer 96 in cooperation with the collector buried layer 95 to form a base area 100 of the PNP transistor.

Next, as shown in FIG. 8(D), boron is selectively diffused from a surface of the epitaxial layer 96 to form an emitter area 101 of the PNP transistor on a surface of the base area 100 within the first island 97 and simultaneously form a base area 102 of the NPN transistor within the second island 98.

Figure 8E:
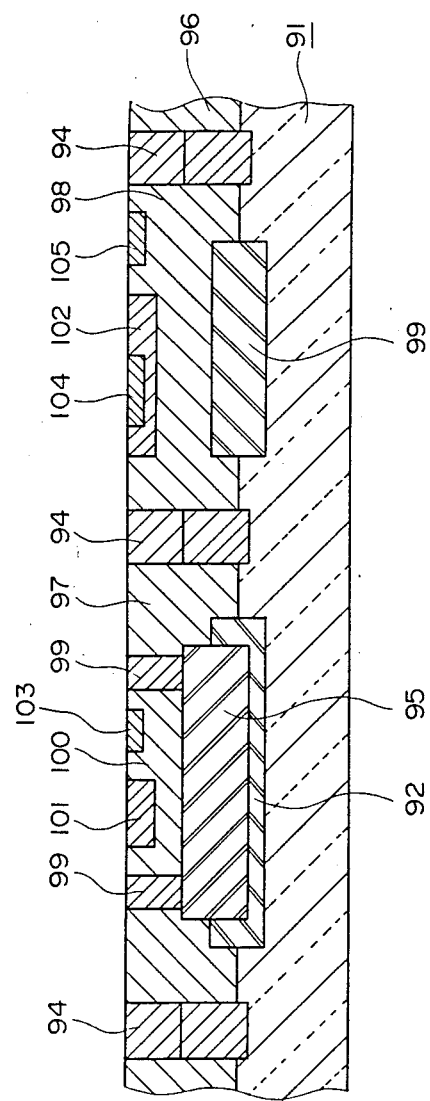

Finally, as shown in FIG. 8(E), an N+-type base contact area 103 is formed on a surface of the base area 100 within the first island 97, and simultaneously emitter area 104 of the NPN transistor is formed on a surface of the base area 102 within the second island 98 and a collector contact area 105 on a surface of the epitaxial layer 96.

The conventional method above described in detail can integrate a vertical type PNP transistor and an NPN transistor in one chip.

According to such a conventional producing method, as described above, since the base area 100 of a vertical type PNP transistor is formed of the epitaxial layer 96, the breadth size of the base area 100 is large and unstable, whereby being incapable of increasing $f_T$ and $h_{FE}$. In addition, a problem has been that $f_T$ and $h_{FE}$ are not stabilized.

In addition, a problem has been that the double isolation diffusion area 94, for isolating a PNP transistor from an NPN transistor or isolating them from other elements, is expanded in the transverse direction, whereby causing problems of improving integrated extent.

Accordingly, according to the present invention, the former problem is solved by forming a base emitter of a PNP transistor by the double diffusion and the latter problem by reducing the depth of an upper diffusion of a double isolation diffusion area 94.

The fourth embodiment is described below in detail with reference to FIGS. 9(A)-(H).

Figure 9A:
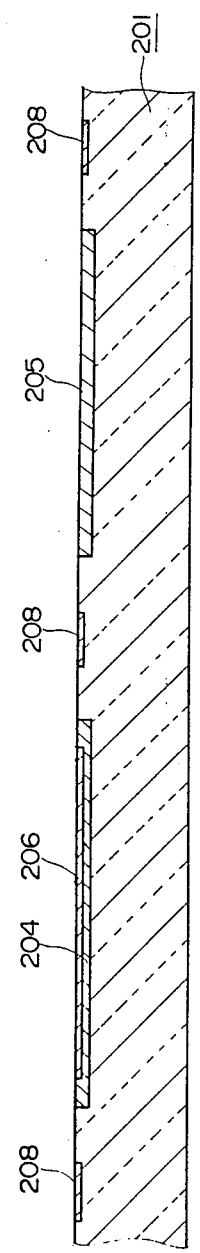

The first step of the present invention is that an N+-type buried layer 204 and an N+-type buried layer 205 are formed at a portion to be a bottom surface of an intended first island 202 and an intended second island 203, respectively, of a surface of a P-type silicon semiconductor substrate 201, a P+-type collector buried layer 206 being formed on the buried layer 204 within the first island 202, and an N-type epitaxial layer 207 being formed on a surface of the substrate 201 (see FIGS. 9(A), (B)).

In this process, as shown in FIG. 9(A), antimony is selectively diffused on a surface of the substrate 201 to form the N+-type buried layer 204 and the N+-type buried layer 205 at a portion to be a bottom surface of the first island 202 and the second island 203, respectively. In addition, boron is diffused on the buried layer 204 within the first island 202 to form the collector buried layer 206 of the vertical type PNP transistor and simultaneously the lower diffusion of the double isolation diffusion area 208 is carried out so as to surround the buried layers 204, 205.

Figure 9B:
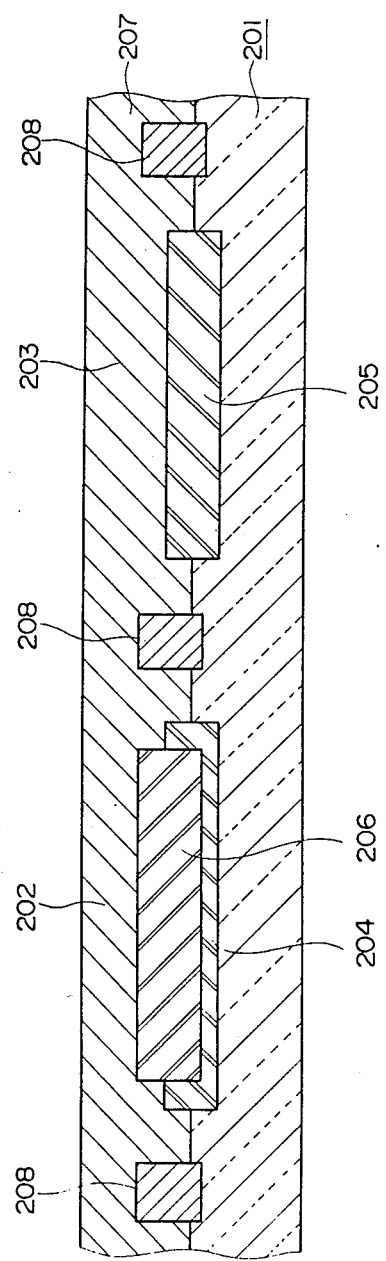

Next, as shown in FIG. 9(B), the epitaxial layer 207 having a thickness of about 7 μm is grown on the substrate 201 by the known epitaxial technique. In this time, the buried layers 204, 205, the collector buried layer 206 and the lower diffusion of the double isolation diffusion area 208 are diffused both upward and downward to form the buried layers 204, 205 and the collector buried layer 206 of a PNP transistor having the desired width.

The second step of the present invention is that impurities giving the P-type are ion implanted from a surface of the first island 202 to form the P-type collector area 209 extending to the collector buried layer 206 (see FIG. 9(C)).

This ion implantation is carried out at a boron dose of $10^{13}$ to $10^{15}$ cm$^{-2}$ and an accelerating voltage of 80 to 200 keV. Impurities are selectively implanted into a surface of the epitaxial layer 207 formed on the collector buried layer 206 within the first island 202 and then driven in to a depth of about 2 to 3 μm to extend to the collector buried layer 206.

In addition, in this step the second island 203 is not implanted with ions.

In this step, the concentration of impurities of the collector area 209 of a vertical type PNP transistor can be increased by diffusing the collector area 209 of a vertical type PNP transistor within the first island 202.

The third step of the present invention is that an N-type base area 210 is formed on a surface of the collector area 209 within the first island 202 and simultaneously the collector-leading area 211 is formed within the second island 203 (see FIG. 9(D)).

In this step, a surface of the collector area 209 within the first island 202 and a part of a surface of the second island 203 are simultaneously implanted with phosphor ions. This ion implantation is carried out at a phosphor dose of $10^{15}$ to $10^{17}$ cm$^{-2}$ and an accelerating voltage of 60 to 100 keV and phosphor ions are driven in to a depth of about 1 μm. Thus, the N-type base area 210 composing a vertical type PNP transistor is formed on a surface of the collector area 203 within the first island 202 and simultaneously the N-type collector-leading area 211 is formed on a part of a surface of the second island 203 within the collector area of the NPN transistor.

After the above described third step, as shown in FIG. 9(E), the upper diffusion layer of the double isolation diffusion area 208 and the collectorleading area 212 of the PNP transistor are simultaneously diffused from the epitaxial layer 207, to connect the lower diffusion layer of the double isolation diffusion area 208 with the upper diffusion layer of the double isolation diffusion area 208, whereby isolating the epitaxial layer 207 and electrically isolating the first island 202 from the second island 203. In addition, the collector-leading area 212 extends to the collector buried layer 206 of the PNP transistor and surrounds all periphery of the collector area 209.

The fourth step of the present invention is that a P-type emitter area 213 is formed on a surface of the base area 210 within the first island 202 and a P-type base area 214 is formed on a surface of the second island 203 (see FIG. 9(F)).

In this step, since the PNP transistor is completed, showing a double diffusion structure consisting of the base area 210 and the emitter area 213, the fluctuation of the vertical type PNP transistor in base width becomes almost equal to that of a double diffusion type NPN transistor. In addition, in this step, a base may be diffused in layers on a surface of the collector-leading area 212 to form a collector contact area 215.

The fifth step of the present invention is that an N+-type emitter area 216 is formed on a surface of the base area 214 within the second island 203 (see FIG. 9(G)).

In this step, an NPN transistor is formed and simultaneously a base contact area 217 is formed on a surface of the base area 210 within the first island 202 and a collector contact area 218 on a surface of the collector-leading area 211 within the second island 203.

The final step of the present invention is that each electrode is formed of vapored aluminum by the known vapor coating technique (see FIG. 9(H)).

In this step, a contact hole is formed in a oxidized silicon film 219 covering a surface of the epitaxial layer 207, a collector electrode 220, a base electrode 221 and an emitter electrode 222 are formed so as to be brought into ohmic contact with the collector contact area 215, the base contact area 217 and the emitter area 213 of the vertical type PNP transistor formed within the first island 202, respectively, and a collector electrode 223, a base electrode 224 and an emitter electrode 225 are formed to be brought into ohmic contact with the collector contact area 218, the base area 214 and the emitter area 216 of the NPN transistor formed within the second island 203, respectively.

According to such a method of the present invention, a double diffusion type vertical type PNP transistor and an NPN transistor can be efficiently integrated in one chip.

According to such a method of the present invention, the base width of a vertical type PNP transistor can be controlled by the diffusion of the base area 210 and the emitter area 213, so that vertical PNP transistors, whose base width is reduced and stabilized and $f_T$ and $h_{FE}$ are increased and stabilized, can be easily integrated in one chip.

In addition, the vertical type PNP transistor and the NPN transistor are simultaneously made with utilizing their producing steps mutually, so that they can be produced efficiently by a small number of processes. Incidentally, only the diffusion of a vertical type PNP transistor is an independent process.

In addition, since the lateral expansion of a double isolation diffusion area 208 can be suppressed, the integrated extent can be improved.

Furthermore, an NPN transistor has an advantage in that $V_{CE(sat)}$ is increased due to the existence of the collector-leading area 211.

In addition, the base width of the NPN transistor can be controlled independently of the base width of the vertical type PNP transistor by controlling the base diffusion and emitter diffusion of the NPN transistor.

The fifth embodiment relates to a semiconductor integrated circuit provided with a vertical type PNP transistor and an integrated injection logic. Also as to this semiconductor integrated circuit, the conventional method is described with reference to FIGS. 10(A)–(E).

At first, as shown in FIG. 10(A), an N+-type buried layer 332 and an N+-type buried layer 333 are formed at portions corresponding to an intended first island and an intended second island on a surface of a P-type semiconductor substrate 331, respectively, by the diffusion, and a lower diffusion of a P+-type double isolation diffusion area 334 is carried out so as to surround the buried layers 332, 333. In addition, a P+-type collector buried layer 335 is diffused in layers on the first island 332.

Next, as shown in FIG. 10(B), an N-type epitaxial layer 336 is grown on a surface of the substrate 331. Simultaneously, the buried layers 332, 333, the collector buried layer 335 and the lower diffusion layer of the double isolation diffusion area 334 are diffused both upward and downward, to form the buried layers 332, 333 and the collector buried layer 335 having the desired breadth size (thickness).

Next, as shown in FIG. 10(C), an upper diffusion layer of the double isolation diffusion area 334 is diffused from a surface of the epitaxial layer 336, and simultaneously a collector-leading area 339 is diffused on the first island 337, to connect the lower diffusion layer of the double isolation diffusion area 337 with the upper diffusion layer of the double isolation diffusion area 337, whereby isolating the epitaxial layer 336 and form the first island 337 and the second island 338. In addition, the collector-leading area 339 extends to the collector buried layer 335 of a PNP transistor within the first island 337 and completely surrounds the eipitaxial layer 336 in cooperation with the collector buried layer 335 to form a base area 340 of a PNP transistor.

Next, as shown in FIG. 10(D), boron is selectively diffused from a surface of the epitaxial layer 336 to form an emitter area 341 of the PNP transistor on a surface of the base area 340 within the first island 337, and an injector area 342 and a base area 343 of an IIL within the second island 338 at a distance.

Figure 10E:
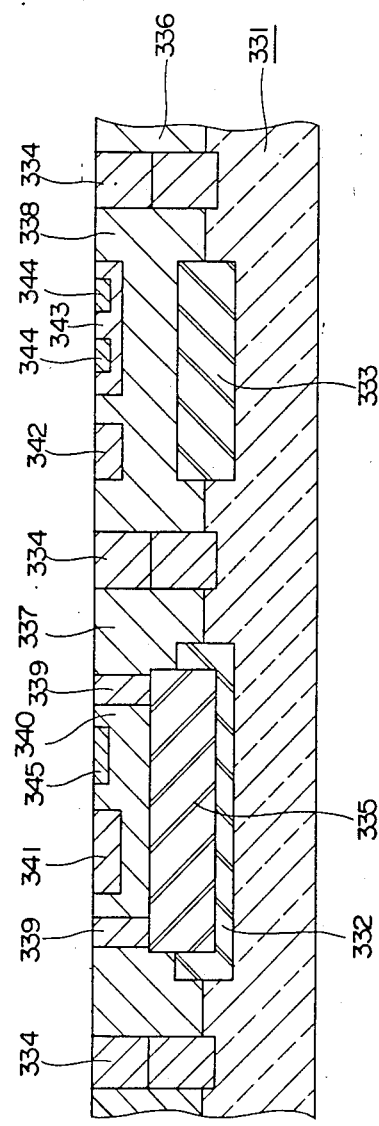

Finally, as shown in FIG. 10(E), and N+-type base contact area 345 is formed on a surface of the base area 340 within the first island 337 and simultaneously a plurality of collector areas 344, 344 . . . of the IIL are formed on a surface of the base area 343 within the second island 338.

Thus, a semiconductor integrated circuit, in which a vertical type PNP transistor and an IIL are contained in one chip, can be formed, but this semiconductor integrated circuit has shown problems similar to the above described vertical type PNP transistor in that $f_T$ and $h_{FE}$ are unstable and the improvement of an integrated extent is hindered due to the lateral expansion of the double isolation diffusion area 334. In addition, an IIL has shown a problem in that an inverse current amplification factor $\beta$ and a switching-over speed are reduced due to a long distance between the base area 343 and the buried layer 333.

According to the present invention, these problems can be solved by forming the base area and the emitter area of the vertical type PNP transistor by the double diffusion, by reducing the thickness of the upper diffusion layer of the double isolation diffusion area, and by forming the base area of the IIL and the collector area of the vertical type PNP transistor simultaneously.

The fifth embodiment is described below with reference to FIGS. 11(A)–(H).

Figure 11A:
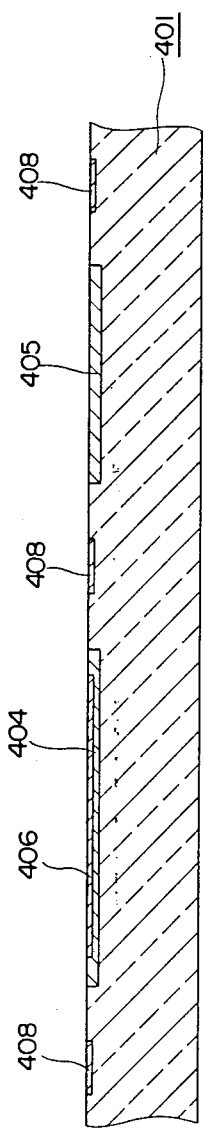

The first step of the present invention is that an N+-type buried layer 404 and an N+-type buried layer 405 are formed at a portion to be a bottom surface of an intended first island 402 and an intended second island 403 on a surface of a P-type silicon semiconductor substrate 401, respectively, a P+-type collector buried layer 406 being formed on the buried layer 404 within the first island 402, and an N-type epitaxial layer 407 being formed on a surface of the substrate 401 (see FIGS. 11(A), (B)).

In this step, as shown in FIG. 11(A), antimony is selectively diffused on a surface of the substrate 401 to form the N+-type buried layers 404, 405 at portions to be a bottom surface of the first and second islands 402, 403. In addition, boron is diffused on the buried layer 404 within the first island 402 to form the collector buried layer 406 of the vertical type PNP transistor and simultaneously the lower diffusion of the double isolation diffusion area 408 is carried out so as to surround each of the buried layers 404, 405.

Figure 11B:
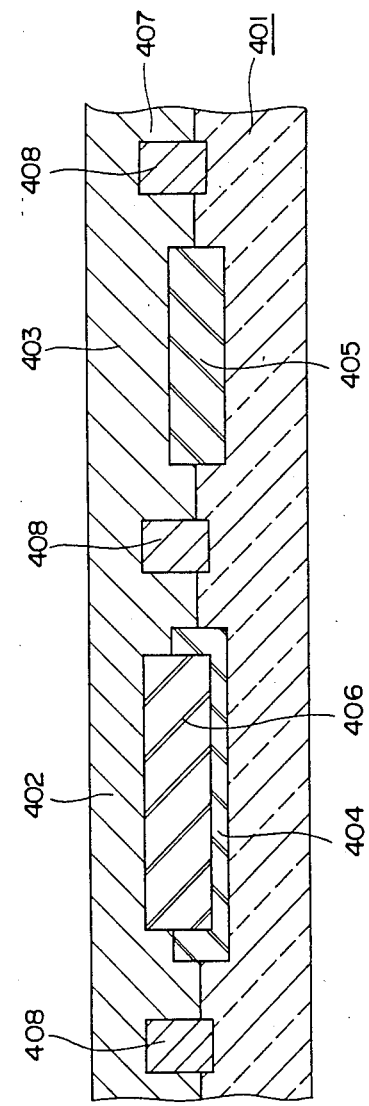

Next, as shown in FIG. 11(B), the epitaxial layer 407 of about 7 $\mu$m thickness is grown on the substrate 401 by the well-known epitaxial technique. Simultaneously, the buried layers 404, 405, the collector buried layer 406 and the lower diffusion layer of the double isolation diffusion area 404 are diffused both upward and downward to form the buried layers 404, 405 and the collector buried layer 406 of the PNP transistor having the desired widths.

Figure 11C:
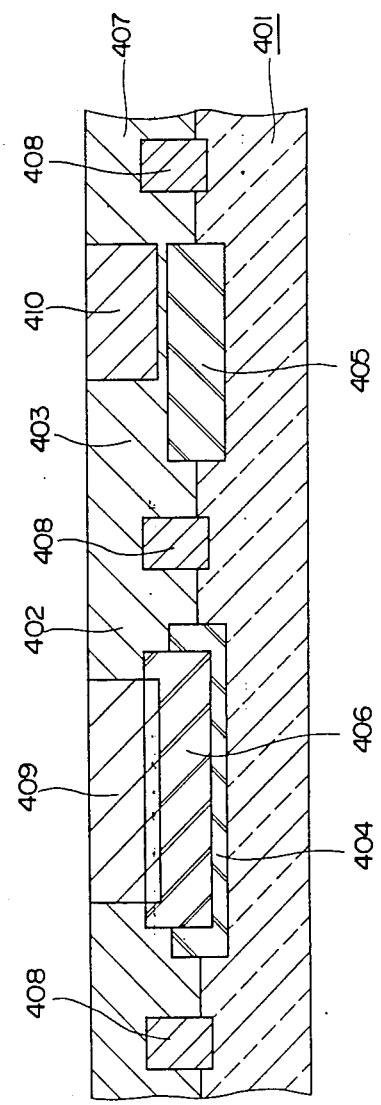

The second step of the present invention is that impurity ions giving a P-type are implanted into the first island 402 and the second island 403 from surfaces thereof to form a P-type collector area 409 extending the collector buried layer 406 within the first island 402 and a base area 410 extending to the vicinity of the buried layer 405 within the second island 403 (see FIG. 11(C)).

This ion implantation is carried out at a boron dose of $10^{13}$ to $10^{15}$ cm$^{-2}$ and an accelerating voltage of 80 to 200 keV. Impurities are selectively implanted into a surface of the epitaxial layer 407 formed on the collector buried layer 406 within the first island 402 and then driven in to a depth of about 2 to 3 μm to extend to the collector buried layer 406. In addition, simultaneously the impurities are implanted into a surface of the epitaxial layer 407 within the second island 403 to form the base area 410 of the IIL almost extending to the buried layer 405 or the position slightly apart from the buried layer 405.

In this step, the impurity concentration of the collector area 409 of the vertical type PNP transistor can be increased by diffusing the collector area 409 of the vertical type PNP transistor within the first island 402, whereby being capable of achieving a double diffusion structure consisting of the base area and the emitter area in the subsequent step. On the other hand, the base area 410 of the IIL within the second island 403 can be very deeply diffused in comparison with the conventional method.

Figure 11D:
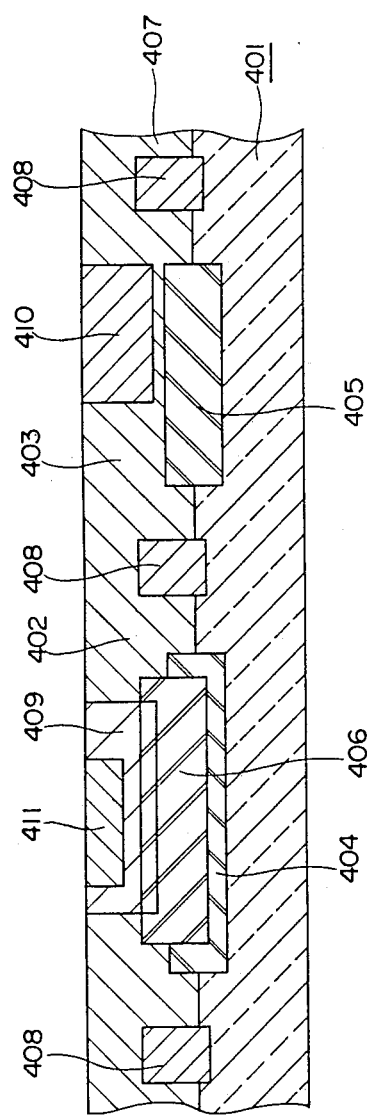

The third step of the present invention is that an N-type base area 411 is formed on a surface of the collector area 409 within the first island 402 (see FIG. 11(D)).

In this step, phosphor ions are implanted into a surface of the collector area 409 within the first island 402. This ion implantation is carried out at a phosphor dose of $10^{15}$ to $10^{17}$ cm$^{-2}$ and an accelerating voltage of 60 to 100 keV and phosphor ions are driven in to a depth of about 1 μm. As a result, the N-type base area 411 composing the vertical type PNP transistor is formed on a surface of the collector area 409 within the first island 402.

Figure 11E:
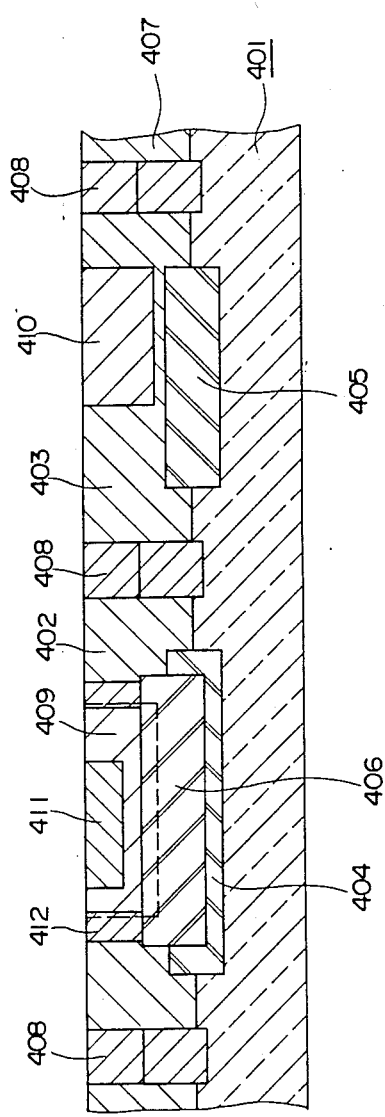

After the above described third step, as shown in FIG. 11(E), the upper diffusion layer of the double isolation diffusion area 408 and a collectorleading area 412 of the PNP transistor are simultaneously diffused from a surface of the epitaxial layer 407, to connect the lower diffusion layer of the double isolation diffusion area 408 with the upper diffusion layer of the double isolation diffusion area 408, whereby isolating the epitaxial layer 407, and electrically isolating the first island 402 from the second island 403. In addition, the collector-leading area 412 extends to the collector buried layer 406 of the PNP transistor and surrounds all periphery of the collector area 409.

The fourth step of the present invention is that a P-type emitter area 413 is formed on a surface of the base area 411 within the first island 402 and a P-type injector area 414 of the IIL is formed on a surface of the second island 403 (see FIG. 11(F)).

In this step, the PNP transistor is completed with having a double diffusion structure consisting of the base area 411 and the emitter area 413, so that the fluctuation of the breadth size of the base area of the vertical type PNP transistor becomes almost equal to that of the double diffusion type NPN transistor. In addition, in this step, a base may be diffused in layers on a surface of the collector-leading area 412 to form a collector contact area 415.

In addition, in this step, simultaneously the injector area 415 is formed on a surface of the epitaxial layer 407 within the second island 403 and a surface base area 416 is formed in layers on the base area 410. The surface base area 416 is formed on portions other than the intended collector areas 417, 417 aiming at the prevention from the reduction of the base-taking out resistance, the reduction of the surface leak current and the inversion of a surface of the base area 410.

The fifth step of the present invention is that a plurality of N+-type collector areas 417, 417 . . . formed on a surface of the base area 410 within the second island 402 to complete the IIL (see FIG. 11(G)).

In this step, the diffusion of the collector areas 417, 417 is usually common to the diffusion of the emitter area of the NPN transistor. A base contact area 418 is formed on a surface of the base area 411 of the PNP transistor within the first island 402, and a plurality of collector areas 417, 417 . . . are formed on a surface of the base area 410 within the second island 403 so as to hardly overlay on the surface base area 416. Accordingly, the collector areas 417, 417 are surrounded by the surface base area 416 at the surface thereof and brought into contact with the base area 410 at the bottom surface thereof.

Figure 11H:
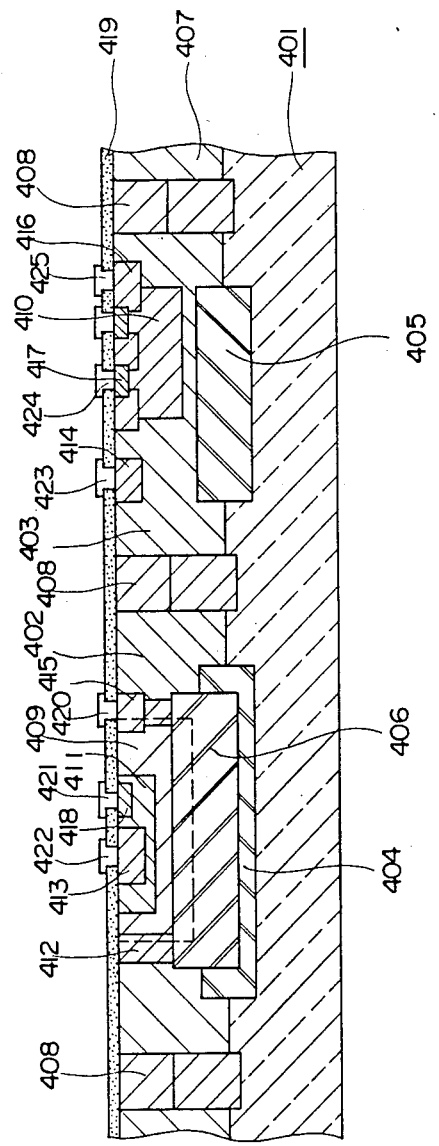

The final step of the present invention is that each electrode is formed of vapored aluminum by the well-known vapor coating technique (see FIG. 11(H)).

In this step, a contact hole is formed in an oxidized silicon film 419 covering a surface of the epitaxial layer 407, and a collector electrode 420, a base electrode 421 and an emitter electrode 422 brought into ohmic contact with the collector contact area 415, the base contact area 418 and the emitter area 413 of the vertical type PNP transistor formed within the first island 402, respectively, being formed, and an injector electrode 423, collector electrodes 424, 424 and a base electrode 425 brought into ohmic contact with the injector area 414, the collector areas 417, 417 and the surface base area 416 of the IIL formed within the second island 403, respectively, being formed.

According to the above described method of the present invention, a double diffusion type vertical type PNP transistor and an IIL can be efficiently integrated in one chip and remarkably improve in characteristics.

That is to say, since the breadth size of a base of a vertical type PNP transistor is reduced and stabilized, $f_T$ and $h_{FE}$ are increased and stabilized. In addition, the lateral expansion of a double isolation diffusion area is reduced and the integrated extent is increased. Furthermore, since the base area 410 of the IIL is deeply diffused simultaneously as the collector area 409 of a vertical type PNP transistor, a distance between the base area 410 and the buried layer 405 of the IIL can be remarkably reduced, the inverse current amplification factor can be improved, and the switching-over speed can be increased.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A method of producing a vertical type transistor comprising the following processes:
   a process of forming one conductivity type buried layer on a region, where a transistor is to be formed, on a surface of the other conductivity type semiconductor substrate and the other conductivity type collector buried layer on said buried layer while a lower diffusion layer of the other conductivity type is formed in a region surrounding said buried layer;

a process of forming said one conductivity type epitaxial layer on the surface of said substrate;

a process of implanting the other conductivity type impurity ions into the corresponding area over said collector buried layer of said epitaxial layer from a surface thereof;

a process of heating said substrate to out-diffuse said lower diffusion layer and said collector buried layer toward said epitaxial layer to make the thickness thereof larger than half of said epitaxial layer while simultaneously diffusing a collector region from the surface of said one conductivity type epitaxial layer to overlap said diffusing collector buried layer a process of implanting said one conductivity type impurity ions into the surface of said collector area and then diffusing them to form a base region;

subsequent to said heating process a process of diffusing an upper diffusion layer of the other conductivity type from the surface of said epitaxial layer so as to extend to said lower diffusion layer and making the area of the upper diffusion layer at the surface of said epitaxial layer be smaller than the area of the lower diffusion layer at the surface of said substrate; and a process of diffusing the other conductivity type impurities on a surface of said base region to form an emitter region, the thickness of said upper diffusion layer being smaller than that of half of the epitaxial layer.

2. A method of producing a semiconductor integrated circuit as set forth in claim 1, in which said base area and said upper diffusion layer are simultaneously diffused.

* * * * *